(12) United States Patent
Hingrainer et al.

(10) Patent No.: US 9,060,439 B2
(45) Date of Patent: Jun. 16, 2015

(54) LOCKING SYSTEM FOR MODULES WITHIN A HOUSING AND A METHOD FOR FITTING

(75) Inventors: Helmut Hingrainer, Raubling (DE); Hermann Muhr, Prackenbach (DE); Andreas Fischl, Geirsthal (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 244 days.

(21) Appl. No.: 13/695,149

(22) PCT Filed: Aug. 3, 2011

(86) PCT No.: PCT/EP2011/063378
§ 371 (c)(1),
(2), (4) Date: Oct. 29, 2012

(87) PCT Pub. No.: WO2012/025354
PCT Pub. Date: Mar. 1, 2012

(65) Prior Publication Data
US 2013/0044440 A1    Feb. 21, 2013

(30) Foreign Application Priority Data

Aug. 23, 2010    (DE) .......................... 10 2010 035 101

(51) Int. Cl.
*H05K 5/02*    (2006.01)
*H05K 7/14*    (2006.01)

(52) U.S. Cl.
CPC ............ *H05K 7/1415* (2013.01); *H05K 5/0221* (2013.01)

(58) Field of Classification Search
CPC .......................... H05K 7/1415; H05K 5/0221
USPC ......... 361/747, 752, 759, 724, 728, 730, 732, 361/726, 725; 292/197, 200, 194, 195, 198, 292/95, 96, 98, 99, 100
See application file for complete search history.

(56) References Cited

U.S. PATENT DOCUMENTS 1,473,986 A * 11/1923 Brown ........................... 70/169

FOREIGN PATENT DOCUMENTS

| DE | 2647362 A1 | 4/1978 |
|---|---|---|
| DE | 3310474 A1 | 10/1983 |
| DE | 2903176 C2 | 12/1983 |
| DE | 68912179 T2 | 4/1994 |
| DE | 4300734 A1 | 7/1994 |
| DE | 102007041406 A1 | 3/2009 |
| GB | 2201453 A | 9/1998 |
| WO | WO 00/59279 A1 | 10/2000 |

OTHER PUBLICATIONS

Notification of Transmittal of Translation of the International Preliminary Report on Patentability for International Application No. PCT/EP2011/063378, dated Feb. 26, 2013, pp. 1-7.
International Search Report for PCT/EP2011/063378 mailed Jan. 24, 2012.

* cited by examiner

*Primary Examiner* — Lisa Lea Edmonds
*Assistant Examiner* — Keith Depew
(74) *Attorney, Agent, or Firm* — Ditthavong & Steiner, P.C.

(57) ABSTRACT

A locking system for fitting and securing modules in a housing includes at least one module, which is surrounded by a chassis and provides a plug connection at a rear side. The front side of the module disposed opposite to the rear side provides a chassis front-plate connected to the chassis. Each module can be locked by a snap-in locking device in a housing, into which the module is pushed. In order to release the snap-in locking device, an opening tool engages in the chassis front-plate. A pulling stress can be exerted on the chassis front-plate by the opening tool, and the module can be withdrawn from the housing.

15 Claims, 2 Drawing Sheets

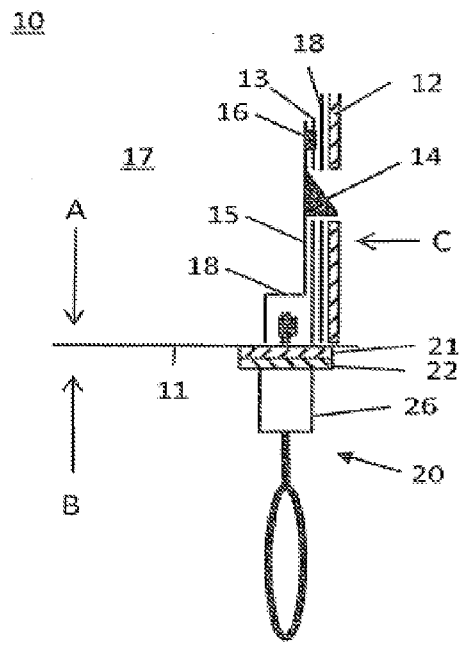
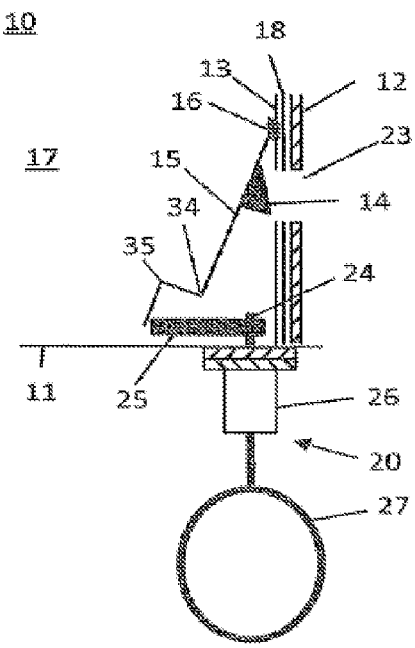
Fig. 1a
Fig. 1b
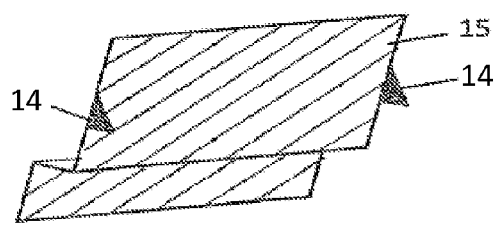
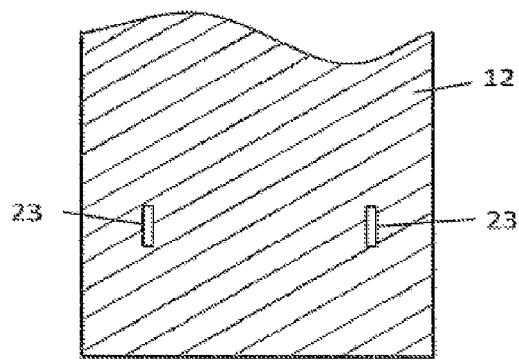
Fig. 2
Fig. 3

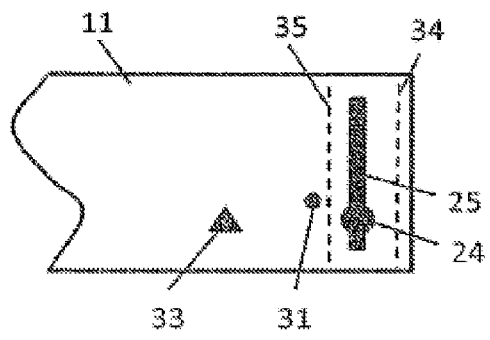 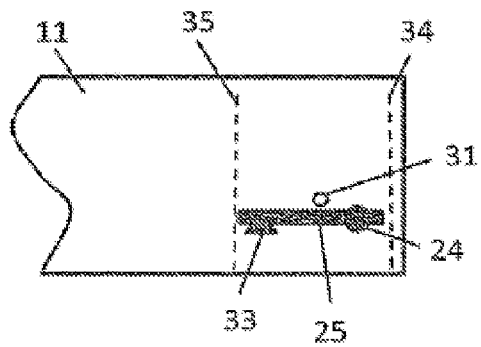
Fig. 4a　　　　　　　　Fig. 4b
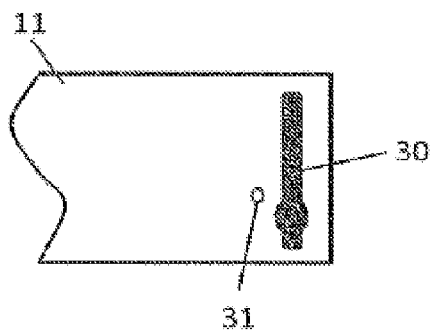
Fig. 5

LOCKING SYSTEM FOR MODULES WITHIN A HOUSING AND A METHOD FOR FITTING

CROSS-REFERENCE TO RELATED APPLICATION

The present application is a national phase application of PCT Application No. PCT/EP2011/063378, filed on Aug. 3, 2011, and claims priority to German Application No. DE 10 2010 035 101.6, filed on Aug. 23, 2010, the entire contents of which are herein incorporated by reference.

BACKGROUND OF THE INVENTION

1. Field of the Invention

The invention relates to a locking system and a method for fitting and securing modules in a housing.

2. Discussion of the Background

Devices in general and electronic measuring devices in particular are generally built up from individual component groups or modules. These are connected to one another via plug connections within a housing with a central module. This allows a flexible configuration of the device with different modules or with extensions through new modules; simple fitting and repair operations are also possible. In particular, electronic modules are connected to a central module via multi-pole plug connections. In order to guarantee a good electrical contact, plugs and sockets are seated tightly together and can only be released from one another with the use of tools.

DE 10 2007 041 406 A1 describes a lock device for a housing for receiving a plug-in module. In this context, the lock device is provided in the region of the housing in which the counter plug is integrated. When the plug-in module is inserted, feet engage alongside the plug connection in the lock device and accordingly secure the plug-in module within the plug and within the housing. To release the plug-in module, an activation element engages in the lock device, releases the snap-in connection and lifts the plug-in module out from the counter plug.

In order to release a plug-in module with this arrangement, the region of the plug connection must be freely accessible. In many cases, this requires the removal of the surrounding housing and is associated with a large space requirement. If several plug-in modules are arranged close to one another, the individual plug positions are only accessible with difficulty.

SUMMARY OF THE INVENTION

Accordingly, embodiments of the present invention advantageously provide a locking system and a method for fitting, in which modules can be inserted into a housing and into a plug connection disposed therein and, in particular, can be released again in a simple manner and with a small space requirement. In this context, it should be ensured that the modules are seated securely in the housing and can only be removed from the housing by authorised persons.

An embodiment of the locking system according to the invention for fitting and securing modules in a housing comprises at least one module which is surrounded by a chassis and provides a plug connection at a rear side. The front side of the module facing opposite to the rear side provides a chassis front-plate connected to the chassis. Each module can be locked by means of a snap-in locking device to a housing into which the module is inserted. To release the snap-in locking device, an opening tool engages in the chassis front-plate. A pulling stress can be exerted on the chassis front-plate by the opening tool, and the module can be withdrawn from the housing.

Accordingly, the module can be released by grasping the front side disposed opposite to the plug connection, so that a housing surrounding the modules and the plug connection can remain in place during the fitting and removal of a module. If a corresponding device is fitted, for example, in a rack, neither a removal of the device from the rack nor a removal of the housing cover is necessary. At the same time, a secure seating of the module in the plug connection and in the housing itself is guaranteed by the snap-in connection between the housing and the module. The snap-in connection can only be released and the module removed with the opening tool according to the invention, so that an unauthorised removal is prevented or at least considerably hampered.

At least two opening tools advantageously engage respectively in an edge region of the chassis front-plate. The chassis front-plate itself provides a lateral wall which is arranged perpendicular to the chassis front-plate on each of these two mutually opposite sides. A snap-in locking device is attached to each lateral wall. The snap-in locking devices on the two lateral walls ensure that the module is seated in the plug connection and in the housing perpendicular to the chassis front-plate and accordingly parallel to the lateral walls of the housing. This guarantees a good contact of the plug connection and reduces a mechanical stress on the plug connection.

The opening tools engaging at the two edge regions of the chassis front-plate ensure a pulling stress perpendicular to the plug connection and prevent a simple release from the plug connection through pulling forces acting uniformly on both sides of the chassis front-plate.

The snap-in locking device provides either one, or as an alternative, at least two snap-in projections. In this context, the at least two snap-in projections are arranged distributed at a distance from one another along the width of the chassis front-plate of the lateral wall of the chassis front-plate and engage in recesses in the lateral wall of the chassis front-plate and of the housing wall. Accordingly, a secure locking of the module and an alignment of the module perpendicular to the plane in which the snap-in projections are arranged is ensured.

Moreover, it is advantageous that the snap-in locking device comprises an elastic material and provides a double rebate in the form of a step, which is aligned parallel to the chassis front-plate. A force directed parallel to the chassis front-plate on the part of the snap-in locking device facing towards the chassis base leads to a widening especially of the rebate facing away from the lateral wall and accordingly reduces the mechanical force on the attachment position of the snap-in locking device on the lateral wall. This achieves a low wear on this component.

The opening tool advantageously provides a hook-shaped key element, a rotatable handle and a pulling element, wherein a first and a second intermediate element is mounted in a rotatable manner between the key element and the rotatable handle. The first intermediate element in this context is advantageously made from a first, soft material and acts as a scratch protection, wherein the second intermediate element comprises a second, low-friction material, over which a sliding of the first intermediate element and also of the rotatable handle is possible. Even after frequent activation of the locking element, the chassis front-plate is neither scratched nor worn, so that wear on the chassis front-plate in the rotation region of the opening tool is reduced. At the same time, the chassis front-plate remains visually unimpaired and attractive.

An embodiment of the method according to the invention for fitting and securing a module in a housing provides at least one module, which is surrounded by a chassis and, at a rear side, a plug connection, at the front side disposed opposite to the rear side, a chassis front-plate is present. The module is inserted into the housing and locked with a snap-in connection. The snap-in connection is advantageously released by rotating an opening tool which engages in the chassis front-plate. The module is then withdrawn from the housing via a pulling stress of the opening tool on the chassis front-plate. Accordingly, a module can be released from a housing simply, with the minimum possible space consumption and withdrawn from the plug connection without damage and with a minimum use of force.

BRIEF DESCRIPTION OF THE DRAWINGS

The invention is explained in greater detail below on the basis of an exemplary embodiment and with reference to the drawings. The drawings are as follows:

FIG. 1a shows an exemplary embodiment of the locking system according to the invention in the locked condition in a schematic view;

FIG. 1b shows the exemplary embodiment according to the invention of the locking system in the open condition;

FIG. 2 shows an exemplary embodiment according to the invention of a snap-in locking device in a perspective view;

FIG. 3 shows a housing wall according to an exemplary embodiment of the invention in a horizontal projection;

FIG. 4a shows an exemplary embodiment of a chassis front-plate according to the invention in the locked condition in a horizontal projection, viewed from the module;

FIG. 4b shows a chassis front-plate according to an exemplary embodiment of the invention corresponding to FIG. 4a in the open condition; and FIG. 5 shows an exemplary embodiment according to the invention of a chassis front-plate in the viewing direction towards the module.

DETAILED DESCRIPTION OF EXEMPLARY EMBODIMENTS OF THE INVENTION

The entire locking system and its manner of functioning are described below with reference to FIGS. 1a and 1b, while FIGS. 2, 3, 4a, 4b and FIG. 5 illustrate individual components in detail. Corresponding parts are shown with the same reference numbers in all the drawings.

The locking system 10 illustrated in FIG. 1a comprises a housing 12 into which a module 17 is inserted and within which it is locked. The module 17, which is not illustrated in greater detail, is surrounded by a chassis, of which one side element 18 is shown here. The chassis side element 18 and the chassis front-plate 11 are preferably rigid but connected to one another in a detachable manner. Accordingly, the chassis front-plate 11 can, for example, be plugged onto the chassis lateral wall 18 and, for example, secured to one another by screw connection or snap-in connection. The chassis front-plate 11 provides two mutually opposite lateral walls 13, which are rigidly connected to the chassis front-plate 11. The lateral walls 13 of the chassis front-plate 11 are preferably arranged along the narrow side of the module 17 on the chassis front-plate 11.

At a distance from the chassis front-plate 11, a snap-in locking device 15 is attached to the lateral wall 13 at an attachment position 16. In this context, the snap-in locking device 15 can be attached to the lateral wall by welding, soldering, gluing, rivets or also with screws at several positions or distributed continuously over the lateral wall. The snap-in locking device 15 comprises an elastic material, for example, a metal strip, which provides a double rebate 34, 35 (see FIG. 1b) in a region facing away from the attachment position 16, which extends parallel to the chassis front-plate and forms a step 18.

In the region of the snap-in locking device 15 facing towards the attachment position 16, a snap-in projection 14 is formed, which engages respectively in a recess 23 in the lateral wall 13 of the chassis front-plate 11, in a recess 23 of the chassis side element 18 and in a recess 23 of the housing 12. In one preferred exemplary embodiment of the locking system, the snap-in locking device 15, which is illustrated in FIG. 2 from the viewing direction C, provides two snap-in projections 14, which are each arranged at the edge of the snap-in locking device 15. The snap-in locking device 15 and the snap-in projections 14 can be embodied in one piece in a simple manner, wherein the snap-in projections are manufactured by bending. This provides a cost-favorable and robust embodiment of the snap-in locking device.

An opening tool 20 is inserted into the chassis front-plate through a lock opening 30, see FIG. 5. A first intermediate element 21, which comprises a first soft material, is disposed on the chassis front-plate. The first intermediate element 21 can comprise, for example, a soft elastomer. A second intermediate element 22 adjoining the first intermediate element comprises a low-friction, smooth material and accordingly allows the rotation of a rotatable handle 26 without also moving the first intermediate element 21. Accordingly, the surface of the chassis front-plate 11 remains scratch-free and undamaged even with frequent use of the opening tool 20.

FIG. 1b shows the locking system 10, which was illustrated in the locked condition in FIG. 1a, in the open condition. In this context, the key-bit 25 of the hook-shaped key element 24 is brought into the illustrated open position by a rotation of the opening tool 20, especially the rotatable handle 26.

Accordingly, the key-bit 25 moves the snap-in locking device 15 away from the lateral wall 13 and therefore withdraws the snap-in projection 14 from the recess 23 in the lateral wall 13, the chassis side element 18 and the housing 12. The recesses 23 in the housing 12 are illustrated in FIG. 3, which shows the housing wall 12 from the viewing direction C, as indicated in FIG. 1a. By pulling on the pulling element 27 of the opening tool 20, the module 17 can be withdrawn from the housing 12.

The rotatable handle 26 and the pulling element 27 can be coupled in a rotationally rigid manner similar to a key, so that the pulling element is also used to exert a torque. In the case of a loose connection between the rotatable handle 26 and the pulling element 27, the pulling element can be enlarged, for example, to form a loop, and in order to exert a strong pulling force.

FIG. 4a shows the chassis front-plate 11 in a horizontal projection corresponding to the arrow A in FIG. 1a. The key element 24 is located between the first rebate 34 and the second rebate 35 of the snap-in locking device 15, which are indicated by dotted lines, wherein the key-bit 25 is aligned parallel to the first and second rebate 34, 35. The snap-in locking device 15 is accordingly locked. A borehole in the chassis front-plate 11 forms a display opening 31. Since light from the interior of the module hardly emerges through the display opening, this appears dark.

FIG. 4b shows the chassis front-plate 11 with a key element 24, of which the key-bit 25 points in a position rotated towards the left. An over-turning of the key-bit 25 beyond the maximum position is prevented by a stop 33 in the form of a protrusion from the chassis front-plate 11. Since light is now reflected from the snap-in locking device 15, the display opening 31 appears light. Other display mechanisms, for example, with a coloured backing of the display opening, are also possible. The display opening 31 is advantageously arranged at a small distance from the second rebate 35 of the snap-in locking device 15 in the chassis front-plate 11, because, in this manner, the snap-in locking device 15 is shown as locked only in the case of a complete engagement of the snap-in projection 14 in the recesses 23. In this manner, a partial engagement is visible and can be better avoided.

FIG. 5 shows the chassis front-plate 11 in a horizontal projection in the direction B, as indicated in FIG. 1*a*. The lock opening 30, into which the key element 24 of the opening tool 20 can engage, is visible. The contour of the lock opening 30 can differ in many ways from the illustrated rectangular shape, so that the snap-in projection 15 can be opened only using a key element 24 with a key-bit 25 with a corresponding contour. Accordingly, access to the modules can be restricted in a simple manner.

All of the features described and/or illustrated can be advantageously combined with one another within the scope of the invention. The invention is not restricted to the exemplary embodiments illustrated. For example, it may be adequate to provide only one module element.

The invention claimed is:

1. A locking system for fitting and securing modules in a housing, said locking system comprising:
    at least one module, which is surrounded by a chassis, provides a chassis front-plate connected to the chassis at a front side of the chassis;
    wherein each module can be locked by a snap-in locking device in the housing, into which the module is inserted;
    wherein the snap-in locking device can be released with an opening tool which engages in the chassis front-plate;
    wherein the chassis front-plate provides a lateral wall perpendicular to the chassis front-plate, and the snap-in locking device is attached to the lateral wall; and
    wherein the snap-in locking device provides a double rebate in stepped shape, which is aligned parallel to the chassis front-plate in a locked condition.

2. The locking system according to claim 1,
    wherein a pulling stress can be exerted on the chassis front-plate by the opening tool, and the module can be withdrawn from the housing.

3. The locking system according to claim 1,
    wherein the snap-in locking device provides at least one snap-in projection.

4. The locking system according to claim 3,
    wherein the lateral wall and the housing each provide recesses, into which the snap-in projections engage.

5. The locking system according to claim 1,
    wherein the snap-in locking device provides at least two snap-in projections, which are arranged and distributed at a distance from one another along a width of the lateral wall.

6. The locking system according to claim 1,
    wherein the snap-in locking device comprises an elastic material.

7. The locking system according to claim 1,
    wherein the chassis front-plate provides a display opening, and the display opening is arranged in a region of the chassis front-plate, which is not covered by the snap-in locking device when the module is locked in the housing, and, is covered by the snap-in locking device when the locking is completely released.

8. The locking system according to claim 1,
    wherein at least two opening tools engage in mutually opposite edge regions of the chassis front-plate.

9. A locking system for fitting and securing modules in a housing, said locking system comprising:
    at least one module, which is surrounded by a chassis, provides a chassis front-plate connected to the chassis at a front side of the chassis;
    wherein each module can be locked by a snap-in locking device in the housing, into which the module is inserted;
    wherein the snap-in locking device can be released with an opening tool which engages in the chassis front-plate;
    wherein the opening tool provides a hook-shaped key element, a rotatable handle and a pulling element, and a first intermediate element and a second intermediate element are arranged mounted in a rotatable manner between the key element and the rotatable handle.

10. The locking system according to claim 9,
    wherein the first intermediate element comprises a first soft material and acts as a scratch protection, and the second intermediate element comprises a second low-friction material, over which the first intermediate element and the rotatable handle slide.

11. The locking system according to claim 9,
    wherein the rotatable handle and the pulling element are formed in one piece.

12. The locking system according to claim 9, wherein the chassis front-plate provides a lateral wall perpendicular to the chassis front-plate and the snap-in locking device is attached to the lateral wall.

13. The locking system according to claim 9,
    wherein at least two opening tools engage in mutually opposite edge regions of the chassis front-plate.

14. A method for fitting and securing a module in a housing, said method comprising:
    providing at least one module, which is surrounded by a chassis, that provides a chassis front-plate on a front side of the chassis;
    wherein the module is pushed into the housing and locked by a snap-in locking device;
    wherein the snap-in locking device is released by activating an opening tool which engages in the chassis front-plate; and
    wherein the snap-in locking device is released by rotating the opening tool which engages in the chassis front-plate.

15. The method according to claim 14, wherein the module is withdrawn from the housing via a pulling stress of the opening tool on the chassis front-plate.

* * * * *